US012469755B2

(12) United States Patent
Tsuyuno et al.

(10) Patent No.: US 12,469,755 B2
(45) Date of Patent: Nov. 11, 2025

(54) POWER MODULE AND POWER CONVERSION DEVICE USING THE SAME

(71) Applicant: HITACHI, LTD., Tokyo (JP)

(72) Inventors: Nobutake Tsuyuno, Tokyo (JP); Takahiro Araki, Tokyo (JP); Takashi Hirao, Tokyo (JP); Takeshi Tokuyama, Tokyo (JP)

(73) Assignee: HITACHI, LTD., Tokyo (JP)

( * ) Notice: Subject to any disclaimer, the term of this patent is extended or adjusted under 35 U.S.C. 154(b) by 389 days.

(21) Appl. No.: 18/009,760

(22) PCT Filed: May 21, 2021

(86) PCT No.: PCT/JP2021/019407
§ 371 (c)(1),
(2) Date: Dec. 12, 2022

(87) PCT Pub. No.: WO2021/261136
PCT Pub. Date: Dec. 30, 2021

(65) Prior Publication Data
US 2023/0283190 A1 Sep. 7, 2023

(30) Foreign Application Priority Data

Jun. 24, 2020 (JP) .................................. 2020-109102

(51) Int. Cl.
*H01L 23/31* (2006.01)
*H01L 25/18* (2023.01)
(Continued)

(52) U.S. Cl.
CPC .......... *H01L 23/3107* (2013.01); *H01L 25/18* (2013.01); *H02P 27/06* (2013.01); *H02M 7/003* (2013.01); *H05K 7/20927* (2013.01)

(58) Field of Classification Search
CPC ..... H01L 23/3107; H01L 25/18; H01L 25/50; H01L 25/16; H01L 25/00; H01L 23/31;
(Continued)

(56) References Cited

U.S. PATENT DOCUMENTS 10,367,426 B2 * 7/2019 Tokuyama ............ H02M 7/003
2011/0051371 A1 * 3/2011 Azuma .................. B60W 10/08
361/699

(Continued)

FOREIGN PATENT DOCUMENTS

JP 2016171203 A 9/2016

OTHER PUBLICATIONS

International Search Report of PCT/JP2021/019407 dated Aug. 3, 2021.

*Primary Examiner* — Adam B Dravininkas
(74) *Attorney, Agent, or Firm* — Mattingly & Malur, PC

(57) ABSTRACT

A power module includes a power semiconductor element converting DC power into AC power and outputting the AC power to a motor; a conductor electrically connected to the power semiconductor element; a substrate having a substrate wiring connected to the conductor on a surface; and a resin sealing material sealing the power semiconductor element, the conductor, and the substrate. The substrate has, at a position in contact with an end portion of the resin sealing material, a concave portion formed by a surface of the substrate wiring becoming concave in a continuously curved surface shape.

10 Claims, 10 Drawing Sheets

(51) Int. Cl.
*H02M 7/00* (2006.01)
*H02P 27/06* (2006.01)
*H05K 7/20* (2006.01)

(58) Field of Classification Search
CPC .......... H01L 23/28; H01L 2224/48091; H01L 2924/181; H01L 21/565; H01L 2924/1815; H01L 2924/1811
See application file for complete search history.

(56) References Cited

U.S. PATENT DOCUMENTS

| | | | | |
|---|---|---|---|---|
| 2013/0077255 | A1* | 3/2013 | Abe | H05K 7/209 |
| | | | | 361/716 |
| 2014/0078803 | A1* | 3/2014 | Nishihara | H02M 7/003 |
| | | | | 363/141 |
| 2016/0293563 | A1* | 10/2016 | Fujino | H01L 23/24 |
| 2017/0223875 | A1* | 8/2017 | Tsuyuno | H02M 7/5387 |
| 2018/0303001 | A1* | 10/2018 | Suwa | H05K 7/2089 |
| 2020/0185295 | A1* | 6/2020 | Ishibashi | H01L 23/3121 |

* cited by examiner (a)

(b)

(a)

(b)

POWER MODULE AND POWER CONVERSION DEVICE USING THE SAME

TECHNICAL FIELD

The present invention relates to a power module and a power conversion device using the same.

BACKGROUND ART

Power conversion devices based on power semiconductor element switching have high conversion efficiency and thus are widely used in, for example, consumer, vehicle, railroad, and substation equipment. Along with this, technology for developing highly productive, compact, and thin power conversion devices is developing day by day.

As a background art in this technical field, there is disclosed in JP2016-171203A (PTL 1). PTL 1 discloses a technique for sealing a circuit board including a semiconductor element with a mold resin.

CITATION LIST

Patent Literature

PTL 1: JP2016-171203A

SUMMARY OF INVENTION

Technical Problem

The semiconductor device described in PTL 1 has a structure in which a dummy wiring is provided on the surface layer of an insulating base material and a protective resin covering the dummy wiring is crushed by a mold during molding to prevent transfer mold resin leakage.

Based on this, an object of the invention is to provide a power conversion device in which wiring substrate miniaturization is realized and yield improvement is achieved by further preventing transfer mold resin leakage attributable to substrate thickness variation during manufacturing and breakage of a substrate surface layer wiring attributable to strong mold clamping.

Solution to Problem

A power module includes a power semiconductor element converting DC power into AC power and outputting the AC power to a motor; a conductor electrically connected to the power semiconductor element; a substrate having a substrate wiring connected to the conductor on a surface; and a resin sealing material sealing the power semiconductor element, the conductor, and the substrate, in which the substrate has, at a position in contact with an end portion of the resin sealing material, a concave portion formed by a surface of the substrate wiring becoming concave in a continuously curved surface shape.

Advantageous Effects of Invention

It is possible to provide a miniaturized and yield-improved power conversion device.

DESCRIPTION OF EMBODIMENTS

Figure 1:
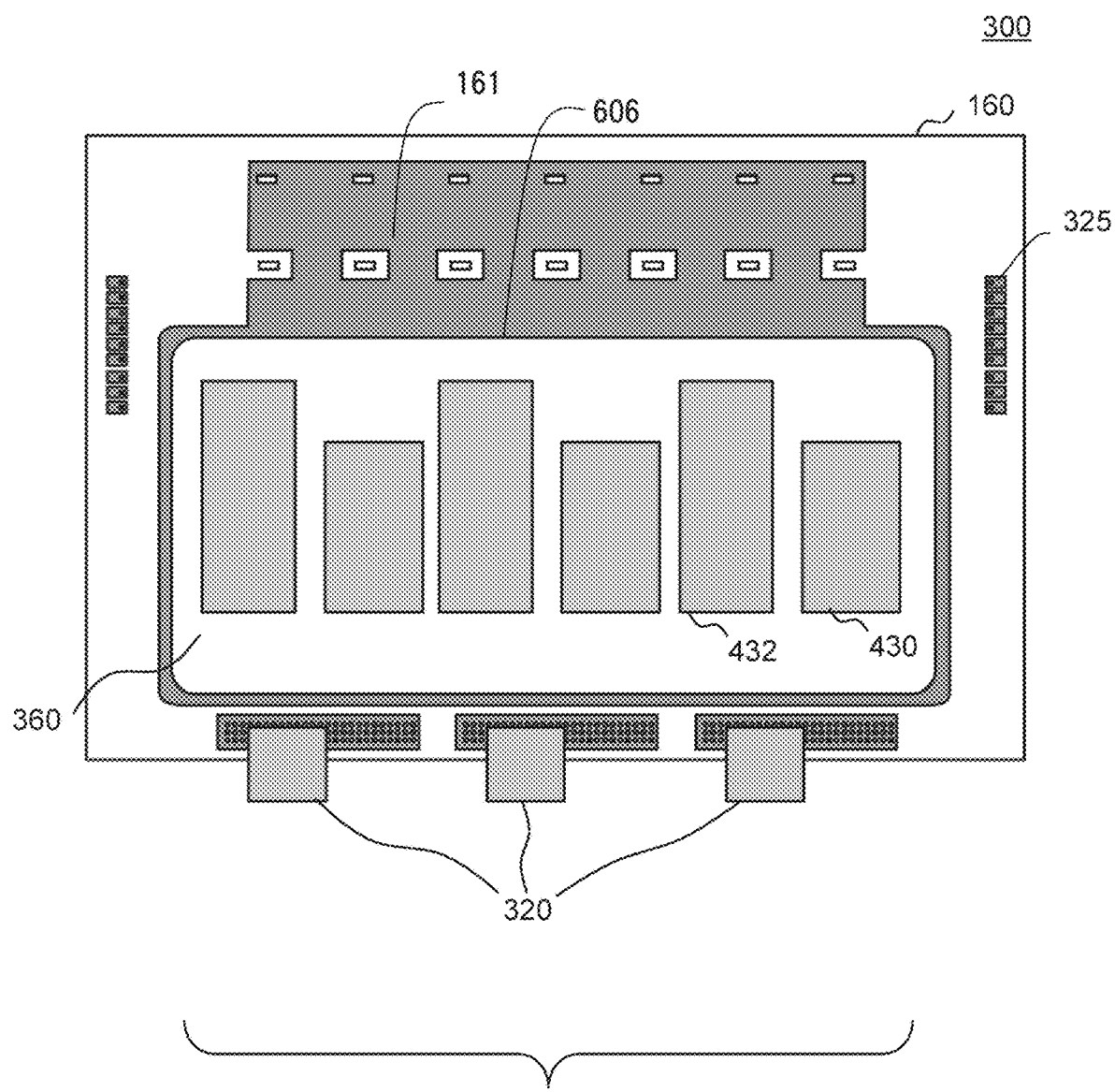
FIG. 1 is a plan view of one embodiment of a power module according to the invention.

Hereinafter, an embodiment of the invention will be described with reference to the drawings. The following description and drawings are examples for describing the invention and are appropriately omitted and simplified for clarity of description. The invention can also be implemented in various other forms. Unless otherwise specified, each component may be singular or plural.

The position, size, shape, range, and so on of each component illustrated in the drawings may not represent the actual position, size, shape, range, and so on so that the invention is understood with ease. Therefore, the invention is not necessarily limited to the positions, sizes, shapes, ranges, and so on disclosed in the drawings.

One Embodiment of Invention and Configuration Thereof

Figure 2:
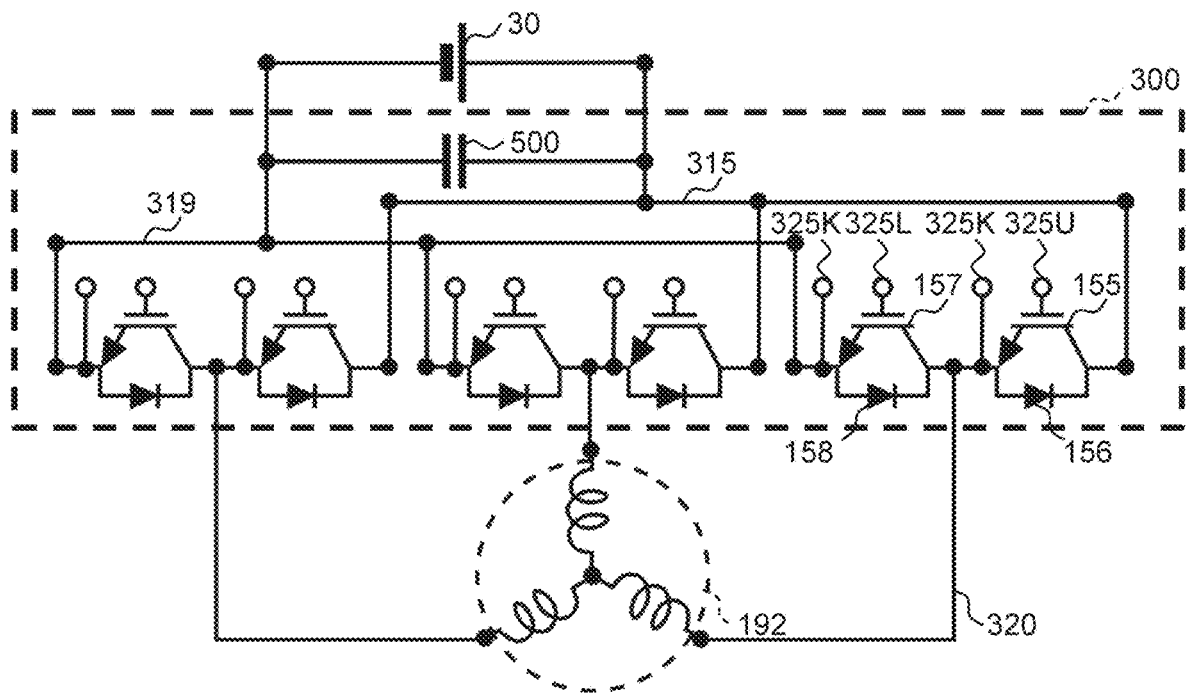
FIG. 2 is a circuit diagram and a semi-transparent plan view of the power module according to the invention.
Figure 2:
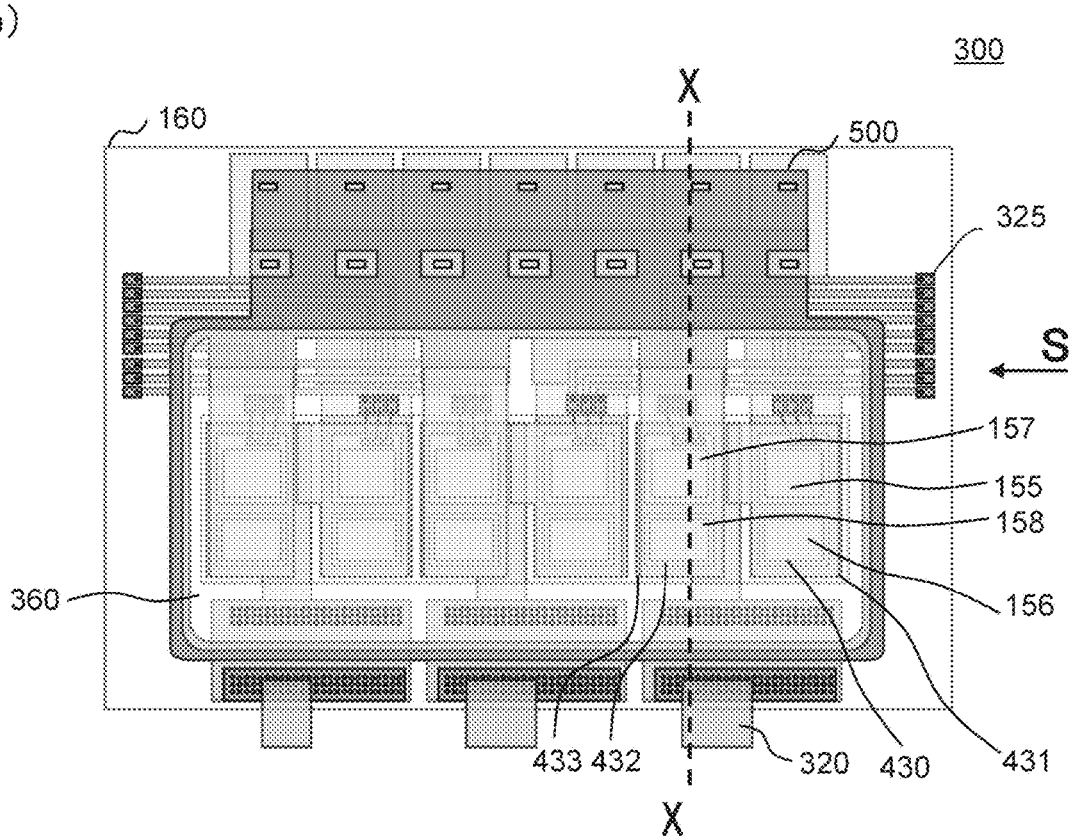

The configuration of one embodiment of a power module according to the invention is illustrated using FIGS. 1, 2(a), and 2(b). FIG. 1 is a plan view of one embodiment of the power module according to the invention, FIG. 2(a) is a circuit diagram of a motor drive system including the power module according to the invention, and FIG. 2(b) is a semi-transparent plan view of FIG. 1.

A power module 300 includes a wiring substrate 160 (hereinafter, substrate 160), a first wiring layer 161 installed on the surface of the substrate 160, and a circuit body 310. The circuit body 310 is an electric circuit and includes a three-phase power semiconductor element and a conductor plate.

The power semiconductor element includes a first power semiconductor element (upper arm circuit active element) 155, a first power semiconductor element (upper arm circuit diode) 156, a second power semiconductor element (lower arm circuit active element) and 157, a second power semiconductor element (lower arm circuit diode) 158 and forms a switching element group in the power module 300. The switching element group and a part of the substrate 160 are transfer mold-sealed and protected with a resin sealing material 360 (hereinafter, sealing material 360).

The conductor plate includes a first conductor plate (upper arm circuit emitter side) 430, a second conductor plate (upper arm circuit collector side) 431, a third conductor plate (lower arm circuit emitter side) 432, and a fourth conductor plate (lower arm circuit collector side) 433.

An R-shaped recess 606 is formed around the entire circumference of the sealing material 360 on the first wiring layer 161. The R-shaped recess 606 is formed by an R-shaped mold protrusion of a transfer molding apparatus 600, which will be described later. The R-shaped recess 606 allows the sealing material 360 to accurately surround only the switching element group and a part of the substrate 160 without protruding from a predetermined sealing range. Details will be described later.

In the power module 300, each three-phase switching element group (power semiconductor elements 155 to 158) has an upper arm circuit and a lower arm circuit. The power semiconductor elements 155 to 158 of this switching element group convert the DC power of a battery 30 into AC power for outputting to and driving a vehicle traveling motor 192 (hereinafter, motor 192). The configuration will be described by taking one of these three phases as an example.

The first conductor plate 430 and the third conductor plate 432 are provided on the emitter side of the upper arm circuit and the lower arm circuit (front side of the paper surface of FIG. 2(b)), respectively. The second conductor plate 431 and the fourth conductor plate 433 are provided on the collector side of the upper arm circuit and the lower arm circuit (back side of the paper surface of FIG. 2(b)), respectively. As illustrated in FIG. 1, the surfaces of the first conductor plate 430 and the third conductor plate 432 are exposed from the resin sealing material 360 on the upper side of the power module 300 (front side of the paper surface). It should be noted that although not illustrated in FIG. 1, on the lower side of the power module 300 (front side of the paper surface), the surfaces of the second conductor plate 431 and the fourth conductor plate 433 are exposed from the resin sealing material 360 as in the case of the first conductor plate 430 and the third conductor plate 432. As will be described later, a cooling member is installed on the exposed surfaces of these conductor plates 430 to 433.

The conductor plates 430 and 431, the power semiconductor element 155, and the diode 156 are electrically connected on the upper arm side by solder connection, which will be described later. Likewise, the conductor plates 432 and 433, the power semiconductor element 157, and the diode 158 are electrically connected on the lower arm side.

The first power semiconductor element 155 or the second power semiconductor element 157 is, for example, an IGBT, a MOSFET, or the like. In the case of a MOSFET, the first diode 156 or the second diode 158 is unnecessary by using a body diode.

As a semiconductor material configuring the power semiconductor element 155 (157), for example, Si, SiC, GaN, GaO, C, or the like can be used.

In FIG. 2(a), a positive electrode wiring 315 interconnects the collector side of the upper arm circuit, and the positive electrodes of the battery 30 and a capacitor 500. The positive electrode wiring 315 represents a positive electrode wiring path connected from an input terminal (not illustrated) connected to the positive electrode sides of the battery 30 and the capacitor 500 to the power semiconductor element of the upper arm circuit via the second conductor plate 431 via the fourth wiring layer 164, which is formed on the surface layer of the substrate 160 and will be described later. An upper arm gate signal terminal 325U is output from a gate electrode of the first power semiconductor element 155 of the upper arm circuit.

In addition, in FIG. 2(a), a negative electrode wiring 319 interconnects the emitter side of the lower arm circuit and the negative electrodes of the battery 30 and the capacitor 500. The negative electrode wiring 319 represents a negative electrode wiring path connected from an input terminal (not illustrated) connected to the negative electrode sides of the battery 30 and the capacitor 500 to the power semiconductor element of the lower arm circuit via the third conductor plate 432 via the first wiring 161, which is formed on the surface layer of the substrate 160. It should be noted that the negative electrode wiring 319 may be connected to GND of the power module 300 and the motor 192. A lower arm gate signal terminal 325L is output from a gate electrode of the second power semiconductor element 157 of the lower arm circuit.

The collector side of the first power semiconductor element 155 and the cathode side of the first diode 156 are joined to the second conductor plate 431. The first conductor plate 430 is electrically joined to the emitter side of the first power semiconductor element 155 and the anode side of the first diode 156.

The collector side of the second power semiconductor element 157 and the cathode side of the second diode 158 are joined to the fourth conductor plate 433. The third conductor plate 432 is electrically joined to the emitter side of the second power semiconductor element 157 and the anode side of the second diode 158.

For this joining, solder may be used or a sintered metal may be used. In addition, although the conductor plates 430 to 433 are not particularly limited insofar as the conductor plates 430 to 433 are made of a material with high electrical conductivity and high thermal conductivity, a copper-based or aluminum-based material is desirable. Although these may be used alone, plating may be performed with Ni, Ag, or the like for joinability enhancement in relation to the solder or sintered metal.

A terminal group 325 is a group of terminals such as a Kelvin emitter signal terminal 325K, the lower arm gate signal terminal 325L, a mirror emitter signal terminal, and the upper arm gate signal terminal 325U.

An AC electrode 320 is electrically connected to the first conductor plate 430 connected to the emitter side of the upper arm circuit and the third conductor plate 432 connected to the collector side of the lower arm circuit and is connected to the motor 192. In a case where neutral point grounding is performed, the lower arm circuit is connected to the negative electrode side of the capacitor 500 instead of GND. The power module 300 converts DC power input from the battery 30 into AC power and outputs the AC power to the motor 192 via the AC electrode 320.

It should be noted that the power module 300 of the present embodiment is a 6-in-1 structure in which three sets of the two arm circuits of the upper arm circuit and the lower arm circuit are integrated. Besides the 6-in-1 structure, the power module 300 of the present embodiment may be a 2-in-1 structure in which two arm circuits are integrated in one power module. In a case where the 6-in-1 structure is used, a terminal for connecting three power modules is unnecessary, the number of output terminals from the power module can be reduced, and miniaturization can be achieved.

Figure 3:
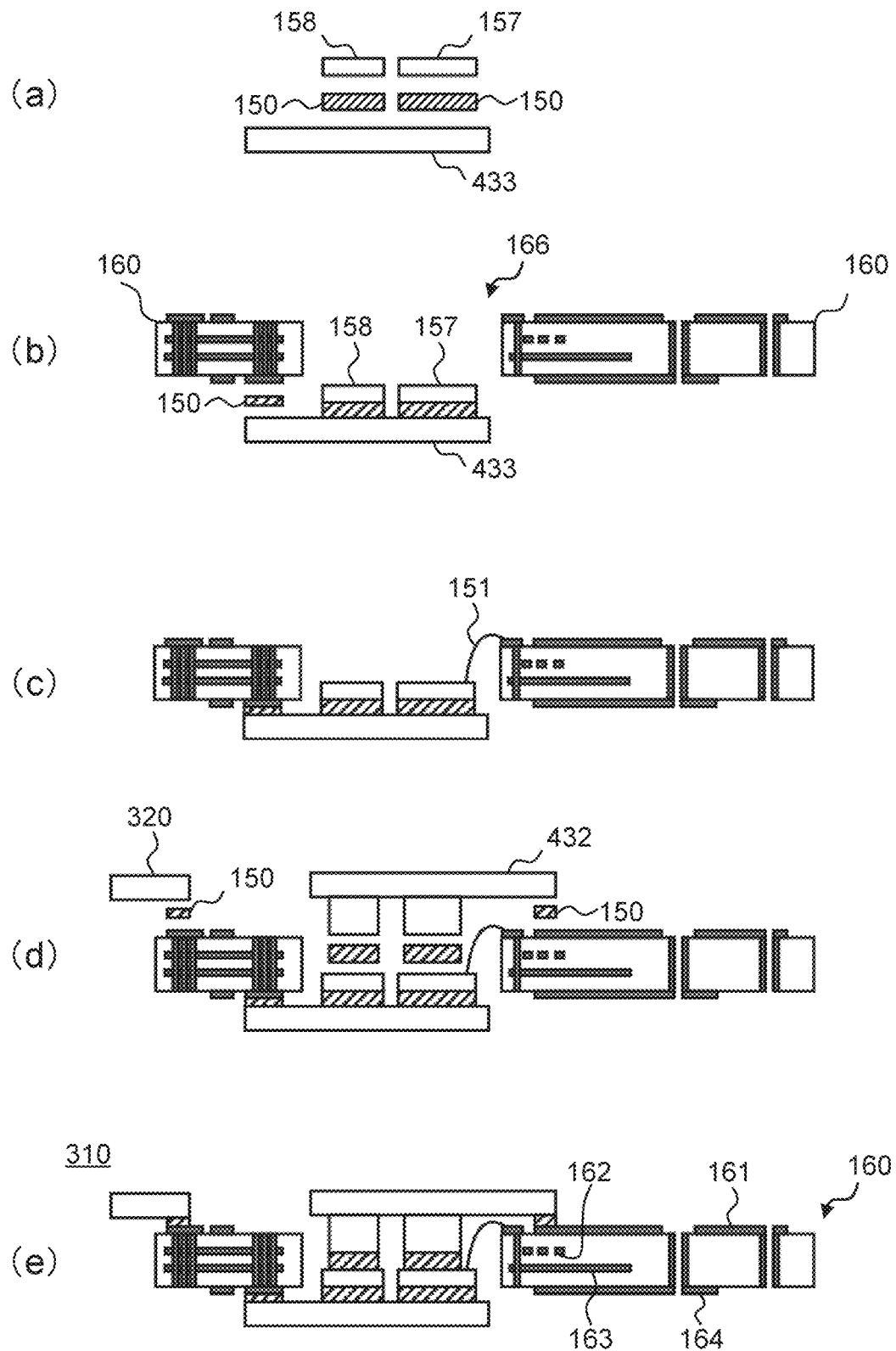
FIG. 3 is a cross-sectional view illustrating a method for manufacturing a circuit body according to the invention.

FIG. 3 is a cross-sectional view illustrating a method for manufacturing the circuit body according to the invention. It should be noted that the cross sections of FIGS. 3(a) to 3(e) are cross sections of the power module 300 in which the cross-sectional position of X-X of FIG. 2(b) is viewed from the arrow S direction of FIG. 2(b).

FIG. 3(a) illustrates a step of solder-connecting the power semiconductor element 157 and the diode 158 to the fourth conductor plate 433. The fourth conductor plate 433 is connected to the collector side of the second power semiconductor element 157 and the cathode side of the second diode 158 via solder 150. In addition, although not illustrated, the second conductor plate 431 is similarly connected to the collector side of the first power semiconductor element 155 and the cathode side of the first diode 156 via the solder 150.

FIG. 3(b) illustrates a step of connecting the substrate 160. The substrate 160 is provided with a hollow region 166, and the conductor plate 433 (431) to which the power semiconductor element 157 (155) and the diode 158 (156) are solder-connected is incorporated. The fourth wiring layer 164 formed on the lower surface layer of the substrate 160 on the side where the AC electrode 320 is solder-connected (left side of the paper surface) and the fourth conductor plate 433 are connected via the solder 150 with the hollow region 166 as a boundary. Meanwhile, although not illustrated, the second conductor plate 431 is connected via the solder 150 to the fourth wiring layer 164 formed on the lower surface layer of the substrate 160 on the side opposite to the side where the AC electrode 320 is solder-connected (right side of the paper surface).

FIG. 3(c) illustrates a wire bonding step. The gate electrode of the power semiconductor element 157 (155) is connected to the wiring substrate 160 through a wire 151.

FIG. 3(d) illustrates a step of solder-connecting the conductor plate 432 and the AC electrode 320. The emitter side of the power semiconductor element 157 and the anode side of the second diode 158 are connected to the third conductor plate 432 via the solder 150, and the third conductor plate 432 is connected via the solder 150 to the first wiring layer 161 formed on the upper surface layer of the substrate 160 on the side opposite to the side where the AC electrode 320 is solder-connected (right side of the paper surface). Meanwhile, although not illustrated, the first conductor plate 430 is connected to the emitter side of the first power semiconductor element 155 and the anode side of the first diode 156 via the solder 150 in the same manner as the third conductor plate 432 and is connected via the solder 150 to the first wiring layer 161 formed on the upper surface layer of the substrate 160 on the side where the AC electrode 320 is solder-connected (left side of the paper surface). In addition, the AC electrode 320 is connected via the solder 150 to the substrate 160 to which the first conductor plate 430 and the fourth conductor plate 433 are solder-connected. As a result, the circuit body 310 that is prepared for transfer molding is obtained.

FIG. 3(e) is a cross-sectional schematic diagram of the circuit body 310 before the transfer molding.

It is desirable that the substrate 160 in the circuit body 310 has four or more wiring layers. In addition, as illustrated in the drawing, it is desirable to use a thick copper wiring of 0.2 mm or more for the first wiring layer 161 and the fourth wiring layer 164, which are surface layers.

The thick copper wiring is an effective material because the thick copper wiring is capable of suppressing heat generation attributable to wiring resistance when a large current is passed. For example, a current of 350 Arms class can be passed by ensuring a cross-sectional area of 40 mm or more in width with a wiring with a thickness of 0.2 mm.

In addition, it is desirable to use a wiring with a thickness of 0.1 mm or less for a second wiring layer 162 and a third wiring layer 163, which are inner layers. When the substrate 160 is fabricated, in a case where an unevenness of a pattern of an inner layer substrate is large, the unevenness is not filled when a substrate prepreg that is the base of the surface layer substrate is crimped. Therefore, the pattern of the inner layer substrate is formed by etching, and then the substrate prepreg is crimped.

On the other hand, as for the surface layer wiring, there is no need to crimp the substrate prepreg after formation by etching, and thus a substrate can be fabricated using the thick copper wiring. For example, in a case where an inner layer wiring of 0.07 mm is used, a current of 350 Arms class can be passed by ensuring a cross-sectional area of 60 mm or more in width for each layer after energization using two inner layers in combination.

The first wiring layer 161 includes, in addition to the negative electrode wiring 319 connected to the battery 30 and the capacitor 500, an electrode connected to the gate electrodes 325L and 325O and the like of the power semiconductor elements 155 to 158, an electrode serving as an output of the AC electrode 320, an electrode connected to the first conductor plate 430, and so on. The second wiring layer 162 and the third wiring layer 163 include a gate wiring and an AC wiring interconnecting the first wiring layer 161 and the fourth wiring layer 164 on the connection side of the AC electrode 320 (left side of the paper surface). This AC wiring is doubled in cross-sectional area by energization using the second wiring layer 162 and the third wiring layer 163 in combination to ensure a necessary cross-sectional area. The fourth wiring layer 164 includes the positive electrode wiring 315 connected to the battery 30 and the capacitor 500, an electrode connected to the fourth conductor plate 433, and so on.

It should be noted that the first wiring layer 161 and the fourth wiring layer 164 are metal surface portions that later form an interface with the substrate 160 on the outer circumference of a transfer mold resin and serve as a resin stop portion coming into contact with the end portion of the sealing material 360. As will be described later, the continuous and curved recess 606 is formed in these metal surface portions so as to surround the entire circumference of the sealing material 360 at the position in contact with the end portion of the sealing material 360. Substrate size reduction can be achieved by connecting one surface of the first wiring layer 161 and the fourth wiring layer 164 to the positive electrode of the capacitor 500, connecting the other surface to the negative electrode, and outputting the inner layer to the gate and AC circuits. In addition, as a result, it is also possible to contribute to increasing the power density of the power module 300.

Although the wiring layers 161 and 164 connected to the conductor plates 430 to 433 are printed on the surface of the substrate 160, a step is generated between the parts where the wiring layers 161 and 164 are printed and not printed. The step becomes significantly large in a case where a thick copper wiring passing a large current is used.

Along with this, the substrate thickness variation attributable to wiring printing during manufacturing increases, and thus it becomes difficult to precisely align the thickness direction. Therefore, when transfer mold sealing is performed with the substrate 160 included, a boundary is formed by crimping using a sealing material injector for sealing, but the thickness variation of the wiring printed on the substrate described above causes resin leakage from the gap of a part where the crimping is not completed. In addition, although there is strong mold clamping as a countermeasure for preventing this, there is a concern that wiring breakage may result therefrom.

In addition, in a case where a large current is passed in this manner, it is important to ensure a wiring cross-sectional area. In the invention, the first wiring layer 161 and the fourth wiring layer 164, which are the surface layer wirings of the substrate 160, are connected to the electrodes of the battery 30 and the capacitor 500 as the positive electrode wiring 315 and the negative electrode wiring 319. As a result, the positive electrode wiring 315 side and the negative electrode wiring 319 side easily serve as laminated wirings and the effect of wiring inductance reduction is achieved.

In addition, by placing the power semiconductor element on the conductor plate thicker than the wiring of the substrate 160, an effective cross section is ensured in a narrow projection area and miniaturization is achieved. In addition, for efficient cooling from above and below the conductor plate, the power semiconductor element projection portion has a wiring substrate-less configuration. The wiring substrate used in the invention may be provided with a thin film resin such as a solder resist covering the surface layer wiring.

Figure 4:
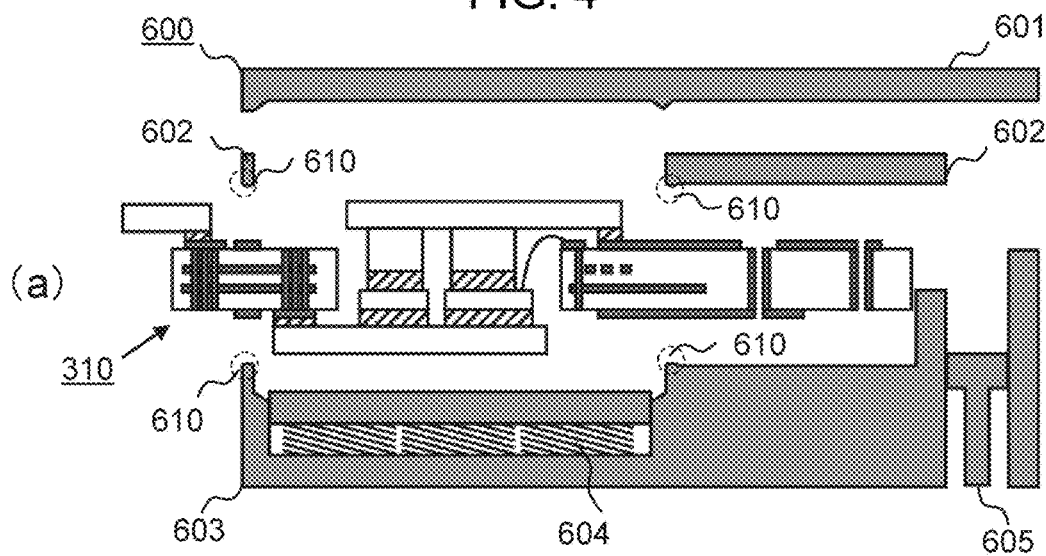
FIG. 4 is a cross-sectional view illustrating a transfer molding step according to the invention.
Figure 4:
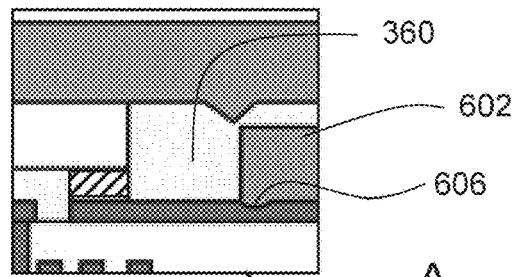
Figure 4:
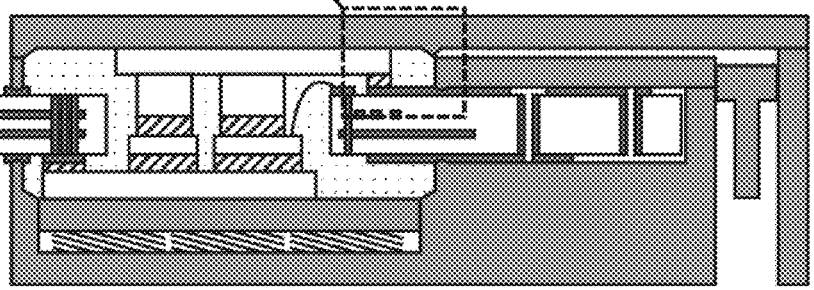
Figure 4:
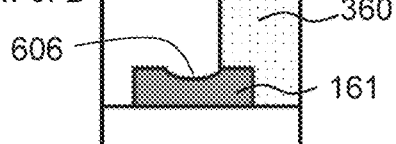
Figure 4:
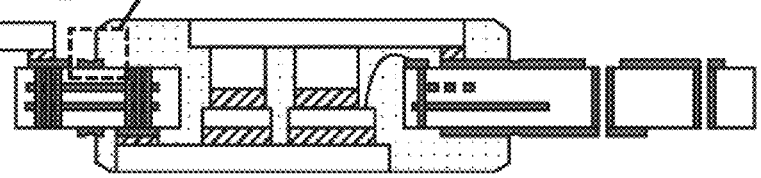

FIG. 4 is a cross-sectional view illustrating a transfer molding step according to the invention.

FIG. 4(a) is an explanatory diagram of the transfer molding apparatus 600 that performs the transfer molding step. The transfer molding apparatus 600 includes an upper mold 601, a middle mold 602, and a lower mold 603 provided with a spring 604 and a plunger 605. The circuit body 310 is set in the transfer molding apparatus 600.

R-shaped mold protrusions 610 are respectively provided on the middle mold 602 and the lower mold 603 of the transfer molding apparatus 600. The R-shaped mold protrusions 610 provided around the entire periphery of the region where the sealing material 360 is injected forms the R-shaped recess 606 (described later) in the surface layer wiring 161 during pressurization.

FIG. 4(b) is an explanatory diagram of the transfer molding step. When the wiring substrate 160 of the circuit body 310 is pressurized by the middle mold 602 and the lower mold 603 as illustrated in the enlarged view of A, the R-shaped recess 606 is formed by the R-shaped mold protrusions 610 of the middle mold 602 and the lower mold 603. The sealing material 360 is injected thereafter. As a result, the R-shaped recess 606 is formed around the entire circumference of the sealing material 360.

As a result, the substrate 160 has, at a position in contact with the end portion of the sealing material 360, the concave portion 606 formed by the surfaces of the substrate wirings 161 and 164 becoming concave in a continuously curved surface shape. By the R-shaped recess 606 becoming larger than the thickness variations of the wirings 161 and 164 on the substrate 160 described above, the thickness variation of the substrate can be absorbed by the depth of the recess. In other words, the concave portion with the same depth being formed by the outer peripheral portion that is clamped during the transfer molding leads to resin leakage prevention.

FIG. 4(c) is a cross-sectional schematic diagram after the transfer molding. As illustrated in the B enlarged view as well as the A enlarged view part described above, the R-shaped recess 606 is formed so as to have the same depth around both surfaces of the hollow region 166 where the semiconductor element is embedded, that is, in the first wiring layer 161 and the fourth wiring layer 164.

As a result, the upper and lower arm circuits and a part of the substrate 160 are sealed with the sealing material 360 by transfer molding. This enables covering of high dimensional accuracy, and thus there is an effect that the cooling water passage provided here can be installed with ease and efficiency. In addition, there is a reliability improvement effect by covering the power semiconductor element with the sealing material 360.

It should be noted that in a case where the sealing material 360 is formed by transfer molding, resin leakage occurs in the event of a step of 20 μm or more. Therefore, even though a wiring layer that is in continuous contact with the end portion of the sealing material is provided on the surface layer, the wiring substrate 160 is affected by the layout of the inner layer wiring and a thickness variation of 20 μm or more occurs, and resin leakage occurs during transfer molding. Therefore, the depth of the R-shaped concave portion needs to be set to 20 μm or more.

Figure 5:
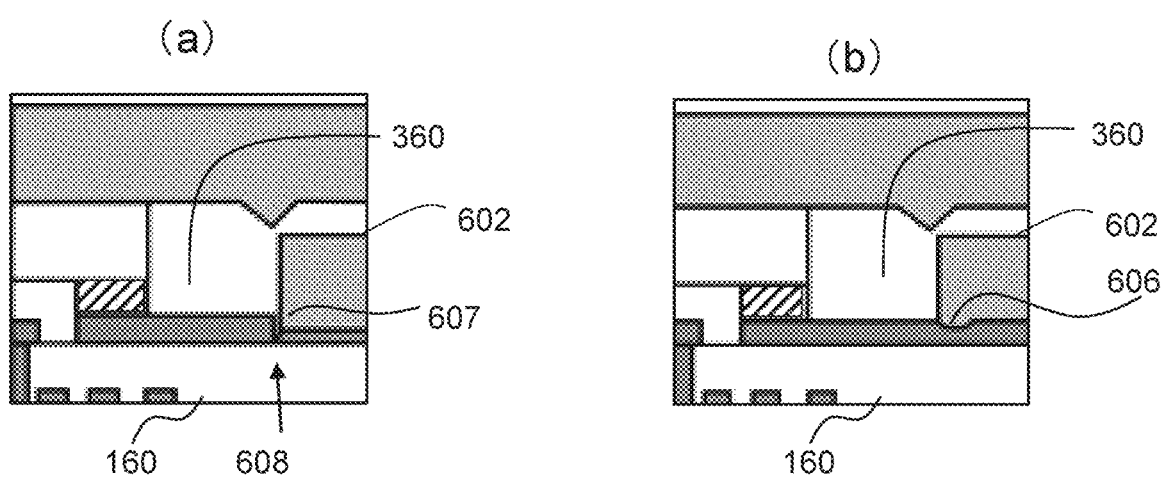
FIG. 5 is a cross-sectional view for comparison between the related art and the invention.

FIG. 5 is a cross-sectional view for comparison between the related art and the invention. FIG. 5(a) is an explanatory diagram of the related art, and FIG. 5(b) is a cross-sectional view illustrating the effect of the invention.

In the related art of FIG. 5(a), the substrate 160 is pressurized against the middle mold 602 of the transfer molding apparatus with an angular mold protrusion 607. Since the substrate 160 is pressurized with this angular shape, stress concentration occurs at the edge and a crack 608 is generated in the wiring on the substrate 160. In this manner, in the substrate pressurization method illustrated in the comparative example, the risk of wiring disconnection is high and a dummy wiring is used for the surface layer wiring.

On the other hand, as illustrated in FIG. 5(b), the invention has a structure in which the substrate 160 is pressurized by the R-shaped mold protrusion 610 to make the surface layer wiring of the substrate 160 concave and prevent the sealing material 360 from leaking out during transfer molding. Therefore, the R-shaped pressurization leads to an effect that local stress concentration does not occur and it is possible to prevent cracks while reducing substrate damage. In addition, as a result, it becomes possible to use an energizing wiring instead of a dummy wiring for the surface layer wiring, a wiring w cross-sectional area required for the flow of a large current can be effectively ensured, and the substrate layout can be made more efficient.

Figure 6:
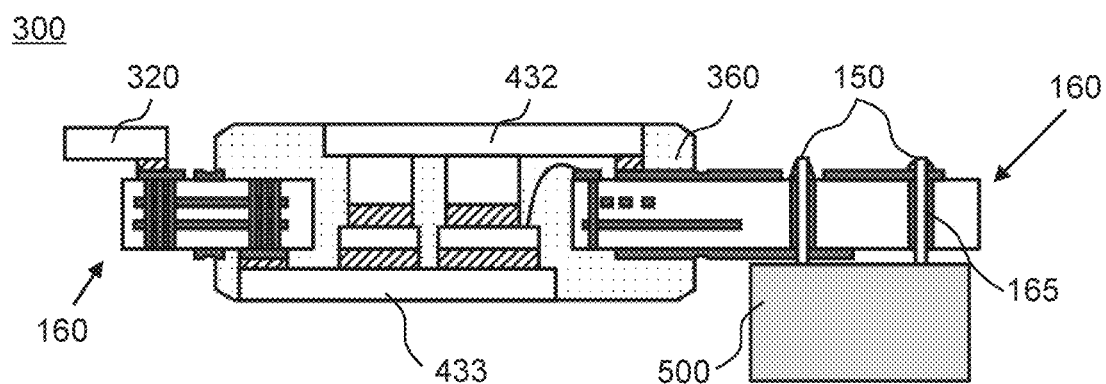
FIG. 6 is a cross-sectional view illustrating a method for manufacturing the power module according to the invention.
Figure 6:
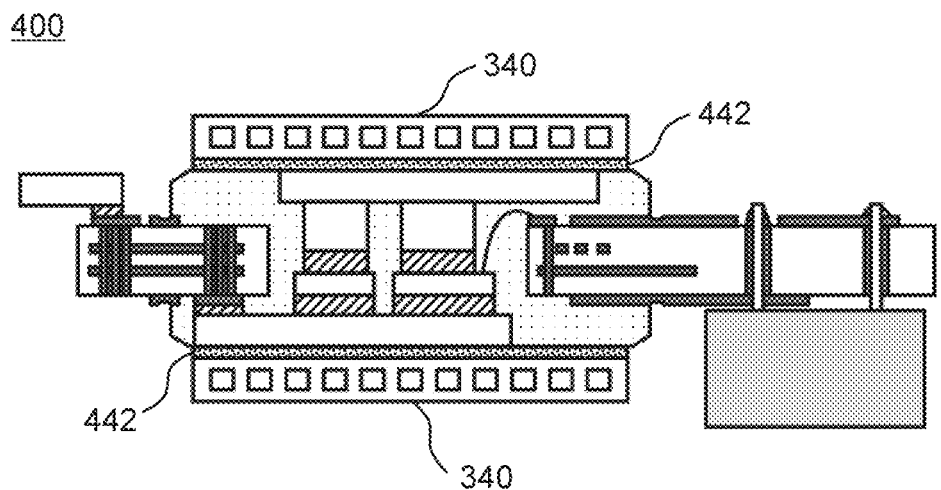

FIG. 6 is a cross-sectional view illustrating a method manufacturing the power module according to the invention.

FIG. 6(a) is a diagram illustrating a step of connecting the capacitor 500. The electrode terminal of the capacitor 500 is connected to the transfer-molded circuit body 310 via a through hole 165 of the substrate 160. This connection is performed by using a robot solder connection apparatus or the like and injecting the solder 150. As a result, the power module 300 is obtained. The life of the capacitor can be extended by this following the transfer molding step in which the capacitor 500 with low heat resistance is heated to 175° C. In addition, there are no protruding components such as the capacitor during transfer molding, and thus clamping with the mold is facilitated.

FIG. 6(b) is a diagram illustrating a step of mounting a cooling member 340. An insulating layer 442 is provided on the surface in contact with the third conductor plate 432, the fourth conductor plate 433, and the sealing material 360. The cooling member 340 is closely attached to and installed on the insulating layer 442. It should be noted that although not illustrated, the cooling member 340 is closely attached via the insulating layer 442 to the first conductor plate 430 and the second conductor plate 431 as well. As a result, a cooler-attached power module 400 (hereinafter, power module 400) is obtained.

In addition, by forming the sealing material 360 by resin leakage-free transfer molding, the insulating layer 442 can be formed thin and high heat dissipation can be achieved. In addition, by using a high-thermal conductivity material for the insulating layer 442, the heat generated by the second power semiconductor elements 157 and 158 can be efficiently radiated to the cooling member 340. Higher heat dissipation can be achieved by installing the cooling member 340 on both surfaces of the power semiconductor elements 155 to 158.

Figure 7:
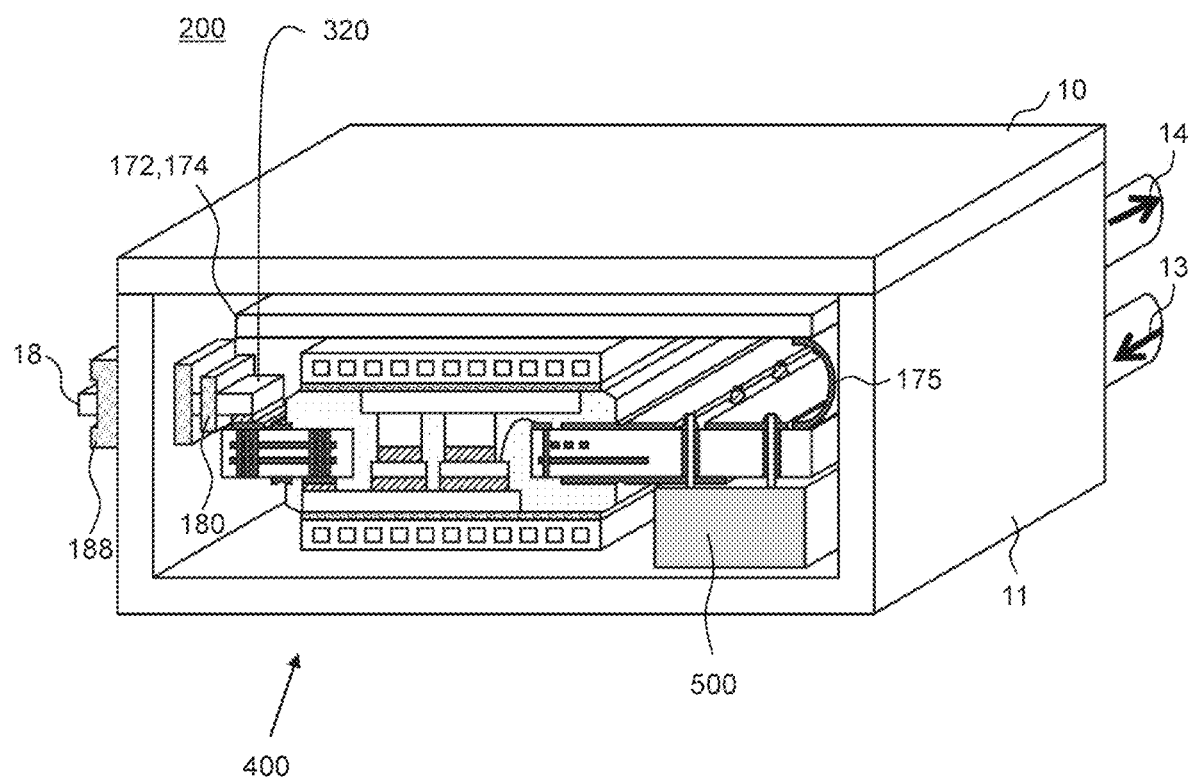
FIG. 7 is a cross-sectional perspective view of a power conversion device according to the invention.

FIG. 7 is a cross-sectional perspective view of a power conversion device according to the invention.

A power conversion device 200 is configured with a lower case 11 and an upper case 10. The power module 400 and so on are accommodated in the power conversion device 200. A cooling water inflow tube 13 and a cooling water outflow tube 14 communicating with the cooling flow path communicated with the cases 10 and 11 protrude from one side surface of the lower case 11 so that the power module 400 is cooled using cooling water or the like.

The upper case 10 and the lower case 11 are formed of an aluminum alloy or the like, and seal and fix the power module 400 inside. The upper case 10 and the lower case 11 may be integrally configured. As a result, the power conversion device 200 has a simple rectangular parallelepiped shape, which facilitates attachment to a vehicle or the like and also facilitates manufacturing.

A connector 188 is attached to one side surface of the lower case 11 (longitudinal direction). An AC terminal 18 is connected to the connector 188. The AC electrode 320 of the power module 300 penetrates a current sensor 180 and is connected to the connector 188.

A control circuit 172 and a driver circuit 174 are disposed above the power module 400. The capacitor 500 is accommodated on the DC terminal side of the power module 400. By disposing the capacitor 500 at the same height as the power module 400, the entire power conversion device 200 can be reduced in thickness. As a result, the degree of freedom in installing the power conversion device 200 in a vehicle is improved.

Figure 8:
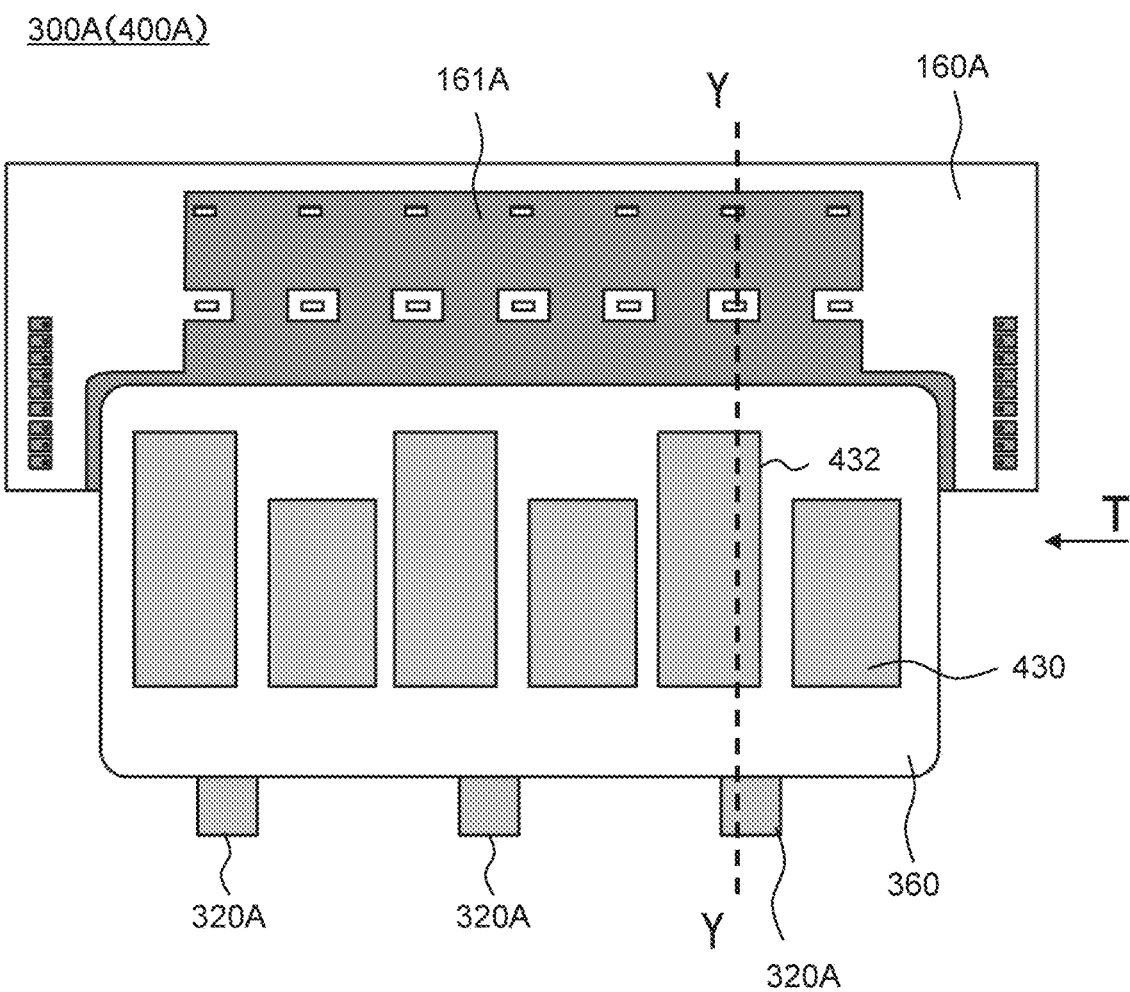
FIG. 8 is a plan view illustrating a modification example of one embodiment of the invention.

FIG. 8 is a plan view illustrating a modification example of one embodiment of the invention.

In the modification example, a substrate 160A of a power module 300A is provided only on the DC electrode side, not around the entire circumference of the sealing material 360. Along with this, a first wiring layer 161A is also provided only on one side of the sealing material 360. An AC electrode 320A directly protrudes from the sealing material 360 unlike in FIG. 1.

Figure 9:
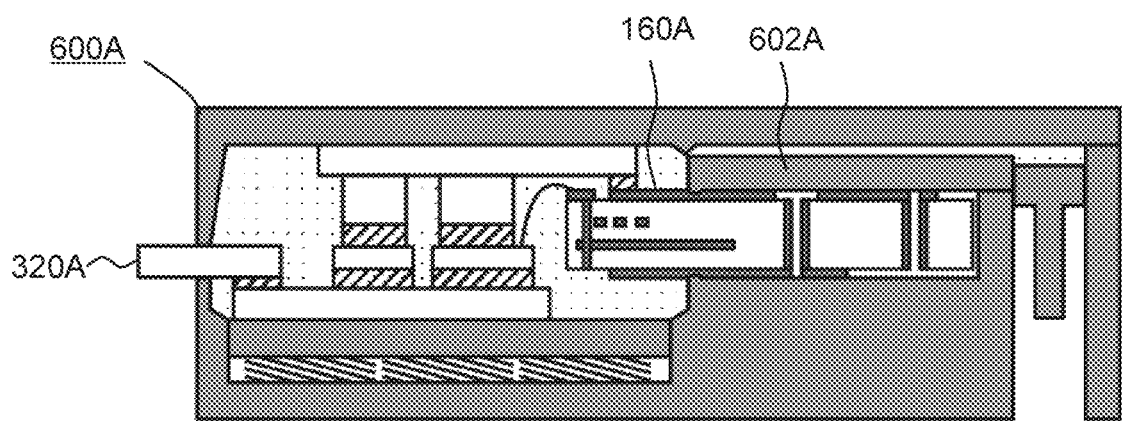
FIG. 9 is a cross-sectional view illustrating a transfer molding step showing a modification example of one embodiment of the invention.

FIG. 9 is a cross-sectional view illustrating a transfer molding step showing a modification example of one embodiment of the invention.

In FIG. 9, with the position of the power semiconductor element as a boundary, the substrate 160A is clamped with the mold of a transfer molding apparatus 600A on the side with the substrate 160A and the AC electrode 320A is directly clamped with an upper mold 601A on the side without the substrate 160A. As a result, the R-shaped recess formed by an R-shaped mold protrusion 610A is formed only on the side of the substrate 160A where DC power flows, which is a part of the periphery of the sealing material 360, and no R-shaped recess is formed on the AC electrode 320A side.

Figure 10:
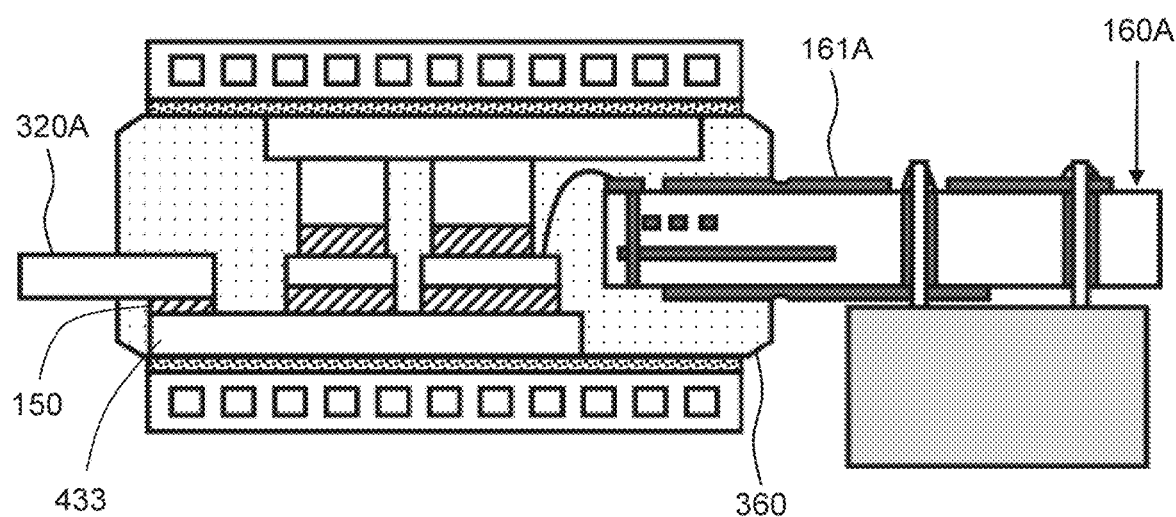
FIG. 10 is a cross-sectional view of a power module illustrating a modification example of one embodiment of the invention.

FIG. 10 is a cross-sectional view illustrating a modification example of one embodiment of the invention. It should be noted that the cross-sectional view of a power module 400A illustrated in FIG. 10 is a view in which the Y-Y cross-sectional position of FIG. 8 is viewed from the T direction.

In the power module 400A partially molded with the sealing material 360 by an R-shaped recess 606A, the AC electrode 320A is connected to the fourth conductor plate 433 and the first conductor plate 430 via the solder 150. In other words, the modification example is a configuration in which the AC electrode 320A and the conductor plates 430 and 433 are directly connected without the substrate 160A interposed therebetween. As a result, the substrate 160A is absent on the AC electrode 320A side, and thus there is no need to consider resin leakage from the transfer mold on one side, the configuration of a transfer molding apparatus 600A and the configuration of the substrate 160A can be simplified, and assembly can be simplified.

The following actions and effects are obtained according to one embodiment of the invention described above.

(1) The power module 300 includes the power semiconductor elements 155 to 158 converting DC power into AC power and outputting the AC power to the motor 192, the conductors 430 to 433 electrically connected to the power semiconductor elements 155 to 158, the substrate 160 having a substrate wiring connected to the conductors 430 to 433 on a surface, and the resin sealing material 360 sealing the power semiconductor elements 155 to 158, the conductors 430 to 433, and the substrate 160. The substrate 160 has, at a position in contact with the end portion of the resin sealing material 360, the concave portion formed by the surface of the substrate wiring becoming concave into a continuous curved surface. In this manner, it is possible to provide the miniaturized and yield-improved power conversion device.

(2) The concave portion formed in the metal surface portions 161 and 164 of the power module 300 is an R-shaped recess 606 with a constant depth. In this manner, resin leakage during transfer molding can be prevented regardless of the thickness variation of the substrate 160.

(3) The concave portion 606 of the power conversion device 200 is formed around the entire circumference of the resin sealing material 360. In this manner, the leakage of the sealing material 360 can be prevented during transfer mold formation.

(4) The concave portion 606 of the power conversion device 200 is formed on both surfaces of the substrate 160. In this manner, the leakage of the sealing material 360 can be prevented during transfer mold formation.

(5) The concave portion 606 of the power conversion device 200 is formed at a part of the periphery of the resin sealing material 360. In this manner, the substrate 160 does not have to be provided on the AC electrode side.

(6) The power conversion device 200 includes the power module 300, the power module 300 is hermetically fixed by the cases 10 and 11, and the cooling flow paths 13 and 14 for cooling the power module 300 are communicated with the cases 10 and 11. In this manner, it is possible to provide the miniaturized and yield-improved power conversion device 200 that enables resin leakage prevention.

It should be noted that the above description is merely an example and, in interpreting the invention, the correspondence between the items described in the above embodiment and the items described in the scope of claims is neither limited nor constrained in any manner. In addition, deletion, replacement with another configuration, and addition of another configuration are possible without departing from the technical idea of the invention, and those aspects are also included in the scope of the invention. Further, the above embodiment and modification examples may be combined in alternative configurations.

REFERENCE SIGNS LIST

10: upper case
11: lower case
13: cooling water inflow tube
14: cooling water outflow tube
18: AC terminal
30: battery
150: solder
151: wire
155: first power semiconductor element (upper arm circuit active element)
156: first power semiconductor element (upper arm circuit diode)
157: second power semiconductor element (lower arm circuit active element)
158: second power semiconductor element (lower arm circuit diode)
160, 160A: wiring substrate
161, 161A: first wiring layer
162: second wiring layer
163: third wiring layer
164: fourth wiring layer
165: penetration through hole
166: hollow region of wiring substrate
172: control circuit
174: driver circuit
175: inter-substrate connection
180: current sensor
188: connector
192: vehicle traveling motor
200: power conversion device
300, 300A: power module
310: circuit body
315: positive electrode wiring
319: negative electrode wiring
320, 320A: AC electrode
325: terminal group
325K: Kelvin emitter signal terminal
325L: lower arm gate signal terminal
325U: upper arm gate signal terminal
340: cooling member
360: resin sealing material
400, 400A: cooler-attached power module
430: first conductor plate (upper arm circuit emitter side)
431: second conductor plate (upper arm circuit collector side)
432: third conductor plate (lower arm circuit emitter side)
433: fourth conductor plate (lower arm circuit collector side)
442: insulating layer
500: capacitor
600, 600A: transfer molding apparatus
601: upper mold
602, 602A: middle mold
603: lower mold
604: spring
605: plunger
606, 606A: R-shaped recess
607: angular mold protrusion
608: crack
610, 610A: R-shaped mold protrusion

The invention claimed is:

1. A power module comprising:
a power semiconductor element converting DC power into AC power and outputting the AC power to a motor;
a conductor electrically connected to the power semiconductor element;
a substrate having a substrate wiring connected to the conductor on a surface; and
a resin sealing material sealing the power semiconductor element, the conductor, and the substrate,
wherein the substrate has, at a position in contact with an end portion of the resin sealing material, a concave portion formed by a surface of the substrate wiring becoming concave in a continuously curved surface shape, and
wherein the concave portion is formed around an entire circumference of the resin sealing material.

2. The power module according to claim 1,
wherein the concave portion has a constant depth.

3. The power module according to claim 1,
wherein the substrate has another substrate wiring on another surface of the substrate and another concave portion is formed in the another surface of the another substrate wiring.

4. The power module according to claim 1,
wherein the concave portion is formed at a part of a periphery of the resin sealing material.

5. A power conversion device comprising the power module according to claim 1, wherein
the power module is hermetically fixed by a case, and
a cooling flow path for cooling the power module is communicated with the case.

6. A power module comprising:
a power semiconductor element converting DC power into AC power and outputting the AC power to a motor;
a conductor electrically connected to the power semiconductor element;
a substrate having a substrate wiring connected to the conductor on a surface; and
a resin sealing material sealing the power semiconductor element, the conductor, and the substrate,
wherein the substrate has, at a position in contact with an end portion of the resin sealing material, a concave portion formed by a surface of the substrate wiring becoming concave in a continuously curved surface shape,
wherein the substrate has another substrate wiring on another surface of the substrate and another concave portion is formed in the another surface of the another substrate wiring.

7. The power module according to claim 6,
wherein the concave portion has a constant depth.

8. The power module according to claim 6,
wherein the concave portion is formed around an entire circumference of the resin sealing material.

9. The power module according to claim 6,
wherein the concave portion is formed at a part of a periphery of the resin sealing material.

10. A power conversion device comprising the power module according to claim 6, wherein
the power module is hermetically fixed by a case, and
a cooling flow path for cooling the power module is communicated with the case.

* * * * *